(12) United States Patent
Wang et al.

(10) Patent No.: US 9,865,619 B2
(45) Date of Patent: Jan. 9, 2018

(54) ARRAY SUBSTRATE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventors: Xiaoxiao Wang, Guangdong (CN); Peng Du, Guangdong (CN); Cong Wang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 186 days.

(21) Appl. No.: 14/779,545

(22) PCT Filed: Aug. 13, 2015

(86) PCT No.: PCT/CN2015/086821
§ 371 (c)(1),
(2) Date: Sep. 23, 2015

(87) PCT Pub. No.: WO2017/024573
PCT Pub. Date: Feb. 16, 2017

(65) Prior Publication Data
US 2017/0221928 A1    Aug. 3, 2017

(30) Foreign Application Priority Data

Aug. 10, 2015  (CN) .......................... 2015 1 0487278

(51) Int. Cl.
*H01L 27/12* (2006.01)
*H01L 29/786* (2006.01)
(Continued)

(52) U.S. Cl.
CPC .... *H01L 27/1222* (2013.01); *H01L 21/02164* (2013.01); *H01L 21/02238* (2013.01);
(Continued)

(58) Field of Classification Search
CPC ................. H01L 27/12; H01L 27/1222; H01L 27/02164; H01L 21/02238
See application file for complete search history.

(56) References Cited

U.S. PATENT DOCUMENTS

2004/0063270 A1    4/2004  Ishikawa
2008/0246042 A1   10/2008  Ting
(Continued)

FOREIGN PATENT DOCUMENTS

CN    101075586 A    11/2007
CN    101345261 A    1/2009
(Continued)

*Primary Examiner* — Phuc Dang
(74) *Attorney, Agent, or Firm* — Kirton McConkie; Evan R. Witt

(57) ABSTRACT

An array substrate and a manufacturing method thereof are provided. The method has steps of: forming a buffer layer, a light-shading layer, and a whole semiconductor layer on a substrate; simultaneously patterning the semiconductor layer and the light-shading layer; and forming a first insulation layer, a first metal layer, a second insulation layer, a second metal layer, a flat layer, and a first transparent conductive layer on the patterned semiconductor layer.

16 Claims, 5 Drawing Sheets

(51) Int. Cl.
*H01L 21/02* (2006.01)
*H01L 21/3213* (2006.01)
*H01L 29/45* (2006.01)
*H01L 29/66* (2006.01)
*H01L 21/22* (2006.01)
*H01L 21/265* (2006.01)
*G02F 1/1368* (2006.01)

(52) U.S. Cl.
CPC .. *H01L 21/02532* (2013.01); *H01L 21/02592* (2013.01); *H01L 21/32133* (2013.01); *H01L 27/124* (2013.01); *H01L 27/127* (2013.01); *H01L 27/1218* (2013.01); *H01L 27/1288* (2013.01); *H01L 29/458* (2013.01); *H01L 29/66757* (2013.01); *H01L 29/78633* (2013.01); *H01L 29/78675* (2013.01); *G02F 1/1368* (2013.01); *G02F 2202/104* (2013.01); *H01L 21/22* (2013.01); *H01L 21/26513* (2013.01)

(56) References Cited

U.S. PATENT DOCUMENTS

| | | | |
|---|---|---|---|
| 2010/0044685 A1* | 2/2010 | Kim | H01L 27/3272 257/40 |
| 2011/0068343 A1 | 3/2011 | Tanabe | |
| 2012/0107982 A1 | 5/2012 | Song et al. | |
| 2013/0300968 A1* | 11/2013 | Okajima | G02F 1/136209 349/43 |
| 2015/0311232 A1* | 10/2015 | Sun | G02F 1/136227 257/72 |
| 2016/0013210 A1 | 1/2016 | Li et al. | |

FOREIGN PATENT DOCUMENTS

| | | |
|---|---|---|
| CN | 102148196 A | 8/2011 |
| CN | 103489877 A | 1/2014 |

* cited by examiner

ARRAY SUBSTRATE AND MANUFACTURING METHOD THEREOF

FIELD OF THE INVENTION

The present invention relates to a technological field of liquid crystal displays, and more particularly to an array substrate and a manufacturing method thereof.

BACKGROUND OF THE INVENTION

Low temperature poly-silicon (LTPS) has a high electron mobility ratio, and thereby it can effectively reduce the area of thin film transistor (TFT) elements, increase the aperture ratio of pixels, and enhance the display lightness of panels, but simultaneously lowers the entire power consumption, so that the manufacturing cost of panels is substantially reduced, so now LTPS has become a research hot point in a field of liquid crystal displays.

In a conventional design of LTPS, mask processes of an array substrate are more complex, generally about ten mask processes are required, so that the production capacity of the products is substantially lowered. Furthermore, since the processes are more complex, the yield rate thereof is also lower, so that LTPS is difficult to promote, and is only applied in small size products.

Refer now to FIG. 1 which is a structural schematic view of an array substrate according to a conventional technology. As shown in FIG. 1, a manufacturing method of a conventional array substrate comprises the following steps of: forming a light-shading layer 11 on a substrate 10; forming a buffer layer 12 on the light-shading layer 11; forming a semiconductor layer 13 on the buffer layer 12, wherein the semiconductor layer 13 has to be treated with a heavy doped and a light doped by exposing and developing methods; forming a first insulation layer 14 on the semiconductor layer 13; forming a first metal layer 15 on the first insulation layer 14; forming a second insulation layer 16 on the first metal layer 15; forming a second metal layer 17 on the second insulation layer 16; forming a flat layer 18 on the second metal layer 17; forming a first transparent conductive layer 101 on a portion of the flat layer 18 which does not correspond to an area of source electrodes and drain electrodes, wherein through a via, the first transparent conductive layer 101 is connected with a portion of the second metal layer which is not of the source electrodes and the drain electrodes; forming a second transparent conductive layer 102 on a portion of the flat layer 18 which corresponds to the area of the source electrodes and the drain electrodes, wherein the second transparent conductive layer 102 is connected with the source electrodes and the drain electrodes; and forming a third second insulation layer 19 between the first transparent conductive layer 101 and the second transparent conductive layer 102.

In the above processes, the manufacturing processes of the light-shading layer, the semiconductor layer, the heavy doping and the light doping, the flat layer, the source electrodes and the drain electrodes, the second insulation layer, the first transparent conductive layer, the third insulation layer, and the second transparent conductive layer all need masks for processing exposing, so that the processes are more complex, and the processing requirement is higher, causing the manufacturing cost to also be higher.

Hence, it is necessary to provide an array substrate and a manufacturing method thereof which solves the problems existing in the conventional technologies.

SUMMARY OF THE INVENTION

The object of the present invention is to provide an array substrate and a manufacturing method thereof which solves a technical problem existing in the conventional technology in which the processes are more complex and the manufacturing cost is higher, so that it is disadvantageous for application in large size products.

For solving the above-mentioned technological problems, the present invention constructs a manufacturing method of an array substrate, which comprises steps of:
forming a buffer layer on a substrate;
forming a whole light-shading layer on the buffer layer, wherein the material of the light-shading layer is an amorphous silicon;
oxidizing the light-shading layer, so as to form an insulation film on the surface of the light-shading layer;
forming a whole semiconductor layer on the insulation film layer, and simultaneously patterning the semiconductor layer and the light-shading layer, wherein portions of the light-shading layer and portions of the semiconductor layer are covered on the buffer layer in order; and the semiconductor layer is configured to form a channel;
forming a first insulation layer on the patterned semiconductor layer;
forming a first metal layer on the first insulation layer, wherein the first metal layer is patterned to form gate electrodes and common electrodes;
forming a second insulation layer on the first metal layer;
disposing a third via on the second insulation layer which corresponds to the common electrodes, wherein the second metal layer is contacted with the common electrodes;
forming a second metal layer on the second insulation layer, wherein the second metal layer is patterned to form drain electrodes and source electrodes;
forming a flat layer on the second metal layer and the second insulation layer uncovered by the second metal layer, wherein a first via is formed on the flat layer; and
forming a first transparent conductive layer on the flat layer, wherein the first transparent conductive layer is connected with the second metal layer through the first via.

In the manufacturing method of the array substrate according to the present invention, after the step of forming the first metal layer on the first insulation layer, the method further comprises: doping a first trigger-conductivity material into a first portion of the patterned semiconductor layer by means of diffusion or ion implantation; wherein the first trigger-conductivity material is configured to increase the conductivity of the semiconductor layer; the density of the first trigger-conductivity material in the patterned semiconductor layer is greater than a first default density; and the first portion is a portion of the patterned semiconductor layer which is uncovered by the gate electrodes.

In the manufacturing method of the array substrate according to the present invention, the method further comprises:
etching the gate electrodes further, so as to decrease the area of the gate electrodes covering the semiconductor layer; and
doping a second trigger-conductivity material into a second portion of the patterned semiconductor layer by means of diffusion or ion implantation; wherein the second trigger-conductivity material is configured to increase the conductivity of the semiconductor layer; the density of the second trigger-conductivity material in the patterned semiconductor layer is less than a second default density; and the second portion is a portion of the patterned semiconductor layer which is uncovered by the etched gate electrodes and no overlap with the first portion.

In the manufacturing method of the array substrate according to the present invention, after the step of forming the second metal layer on the second insulation layer, the method further comprises: disposing a second via on the second insulation layer and the first insulation layer; wherein the source electrodes and the drain electrodes are connected with the semiconductor layer through the second via.

In the manufacturing method of the array substrate according to the present invention, the material of the insulation film is silica ($SiO_2$).

In the manufacturing method of the array substrate according to the present invention, before the step of forming the flat layer on the second metal layer and the second insulation layer uncovered by the second metal layer, the method further comprises:

forming a second transparent conductive layer on the second metal layer which corresponds to the common electrodes.

In the manufacturing method of the array substrate according to the present invention, the first transparent conductive layer includes pixel electrodes.

In the manufacturing method of the array substrate according to the present invention, the material of the semiconductor layer is a low temperature poly-silicon (LTPS).

For solving the above-mentioned technological problems, the present invention constructs a manufacturing method of an array substrate, which comprises steps of:

forming a buffer layer on a substrate;

forming a whole light-shading layer on the buffer layer;

forming a whole semiconductor layer on the light-shading layer, and simultaneously patterning the semiconductor layer and the light-shading layer, wherein portions of the light-shading layer and portions of the semiconductor layer are covered on the buffer layer in order; and the semiconductor layer is configured to form a channel;

forming a first insulation layer on the patterned semiconductor layer;

forming a first metal layer on the first insulation layer, wherein the first metal layer is patterned to form gate electrodes and common electrodes;

forming a second insulation layer on the first metal layer;

forming a second metal layer on the second insulation layer, wherein the second metal layer is patterned to form drain electrodes and source electrodes;

forming a flat layer on the second metal layer and the second insulation layer uncovered by the second metal layer, wherein a first via is formed on the flat layer; and forming a first transparent conductive layer on the flat layer, wherein the first transparent conductive layer is connected with the second metal layer through the first via.

In the manufacturing method of the array substrate according to the present invention, after the step of forming the first metal layer on the first insulation layer, the method further comprises: doping a first trigger-conductivity material into a first portion of the patterned semiconductor layer by means of diffusion or ion implantation; wherein the first trigger-conductivity material is configured to increase the conductivity of the semiconductor layer; the density of the first trigger-conductivity material in the patterned semiconductor layer is greater than a first default density; and the first portion is a portion of the patterned semiconductor layer which is uncovered by the gate electrodes.

In the manufacturing method of the array substrate according to the present invention, the method further comprises:

etching the gate electrodes further, so as to decrease the area of the gate electrodes covering the semiconductor layer; and doping a second trigger-conductivity material into a second portion of the patterned semiconductor layer by means of diffusion or ion implantation; wherein the second trigger-conductivity material is configured to increase the conductivity of the semiconductor layer; the density of the second trigger-conductivity material in the patterned semiconductor layer is less than a second default density; and the second portion is a portion of the patterned semiconductor layer which is uncovered by the etched gate electrodes and no overlap with the first portion.

In the manufacturing method of the array substrate according to the present invention, after the step of forming the second metal layer on the second insulation layer, the method further comprises: disposing a second via on the second insulation layer and the first insulation layer; wherein the source electrodes and the drain electrodes are connected with the semiconductor layer through the second via.

In the manufacturing method of the array substrate according to the present invention, the material of the light-shading layer is an amorphous silicon; and the method further comprises:

oxidizing the light-shading layer, so as to form an insulation film on the surface of the light-shading layer; wherein the material of the insulation film is silica ($SiO_2$).

In the manufacturing method of the array substrate according to the present invention, after the step of forming the second insulation layer on the first metal layer, the method further comprises:

disposing a third via on the second insulation layer which corresponds to the common electrodes, wherein the second metal layer is contacted with the common electrodes.

In the manufacturing method of the array substrate according to the present invention, before the step of forming the flat layer on the second metal layer and the second insulation layer uncovered by the second metal layer, the method further comprises:

forming a second transparent conductive layer on the second metal layer which corresponds to the common electrodes.

In the manufacturing method of the array substrate according to the present invention, the first transparent conductive layer includes pixel electrodes.

The present invention further provides an array substrate, which comprises:

a buffer layer formed on a substrate;

a light-shading layer formed on the buffer layer;

a semiconductor layer formed on the light-shading layer, wherein the semiconductor layer is configured to form a channel;

a first insulation layer formed on the semiconductor layer;

a first metal layer formed on the first insulation layer, wherein the first metal layer includes gate electrodes and common electrodes of a thin film transistor;

a second insulation layer formed on the first metal layer;

a second metal layer formed on the second insulation layer, wherein the second metal layer includes drain electrodes and source electrodes of the thin film transistor;

a flat layer formed on the second metal layer and a portion of the second insulation layer which is uncovered by the second metal layer, wherein the flat layer is provided with a first via; and a first transparent conductive layer formed on the flat layer, wherein the first transparent conductive layer is connected with the second metal layer through the first via.

In the array substrate according to the present invention, a second transparent conductive layer is further formed on the second metal layer which corresponds to the common electrodes.

In the array substrate according to the present invention, the first transparent conductive layer includes pixel electrodes.

In the array substrate according to the present invention, the material of the semiconductor layer is a low temperature poly-silicon (LTPS).

In the array substrate and the manufacturing method thereof according to the present invention, by improving the conventional manufacturing method, the manufacturing processes are simplified, and the production cost is reduced.

DETAILED DESCRIPTION OF THE PREFERRED EMBODIMENTS

Figure 1:
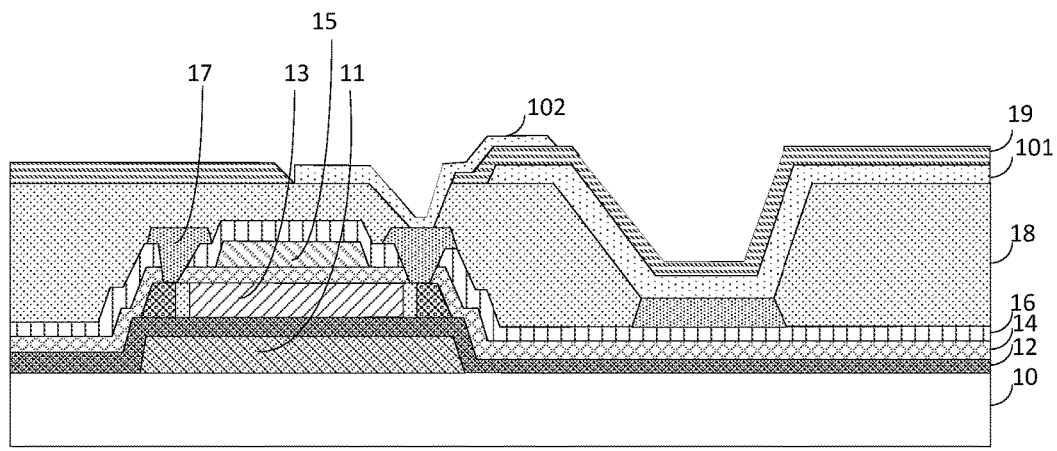
FIG. 1 is a structural schematic view of an array substrate according to a conventional technology.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inner, outer, side, etc., are only directions with reference to the accompanying drawings, so that the used directional terms are used to describe and understand the present invention, but the present invention is not limited thereto. In the drawings, units with similar structures use the same numerals.

Figure 2:
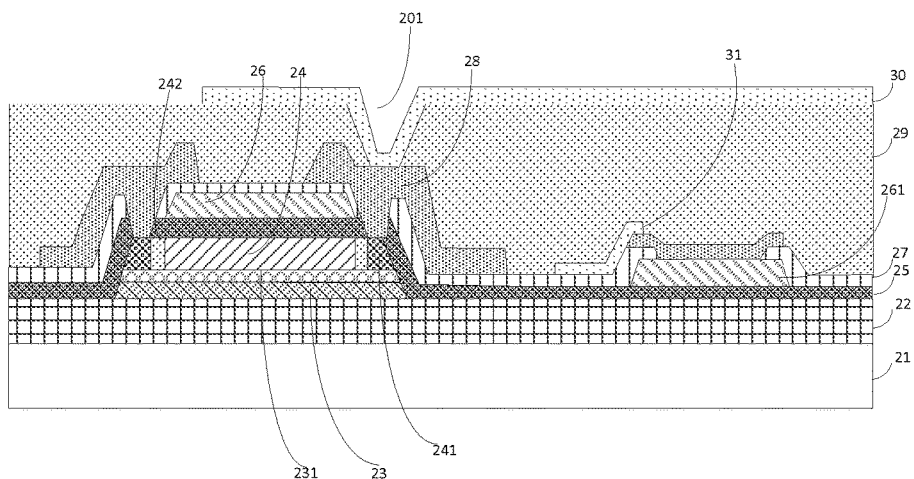
FIG. 2 is a structural schematic view of an array substrate according to the present invention.

Refer now to FIG. 2, which is a structural schematic view of an array substrate according to the present invention.

As shown in FIG. 2, an array substrate according to present invention comprises: a substrate 21, a buffer layer 22, a light-shading layer 23, a semiconductor layer 24, a first insulation layer 25, a first metal layer, a second insulation layer 27, a second metal layer 28, a flat layer 29, and a first transparent conductive layer 30.

The buffer layer 22 is formed on the substrate 21; the light-shading layer 23 is formed on the buffer layer 22; the semiconductor layer 24 is formed on the light-shading layer 23, wherein an insulation film 231 is disposed between the semiconductor layer 24 and the light-shading layer 23, and the semiconductor layer 24 is used for forming a channel; the first insulation layer 25 is formed on the semiconductor layer 24; the first metal layer is formed on the first insulation layer 25, wherein the first metal layer includes a gate electrode area 26 and a common electrode area 261 of a thin film transistor; the second insulation layer 27 is formed on the first metal layer; the second metal layer 28 is formed on the second insulation layer 27, wherein the second metal layer 28 includes a drain electrode area and a source electrode area of the thin film transistor; the flat layer 29 is formed on the second metal layer 28 and a portion of the second insulation layer 27 which is uncovered by the second metal layer, and the flat layer 29 is provided with a first via 201; the first transparent conductive layer 30 is formed on the flat layer 29, wherein the first transparent conductive layer 30 is connected with the second metal layer 28 through the first via 201, and the first transparent conductive layer 30 includes pixel electrodes; and further a second transparent conductive layer 31 is formed on a portion of the second metal layer 28 which corresponds to the common electrode area 261.

Figure 3:
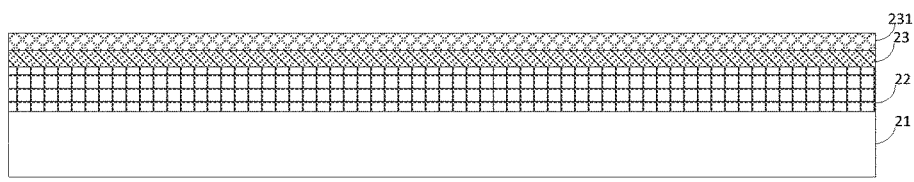
FIG. 3 is a structural schematic view showing steps 1 to 3 of a manufacturing method of the array substrate according to the present invention.

A manufacturing method of the above-mentioned array substrate comprises following steps of:

As shown in FIG. 3.

S101: forming the buffer layer 22 on the substrate 21.

S102: forming a whole layer of the light-shading layer 23 on the buffer layer 22, wherein the material of the light-shading layer is an amorphous silicon, for example a-si.

S103: oxidizing the light-shading layer, and forming the insulation film 231 on the surface of the light-shading layer.

If the material of the light-shading layer 23 is amorphous silicon, after being oxidized, the insulation film 231 of silica ($SiO_2$) is formed on the surface of the light-shading layer 23, which can effectively avoid that the electric charge in the channel being transferred into the amorphous silicon.

S104: forming a whole layer of the semiconductor layer on the insulation film 231, and simultaneously patterning the semiconductor layer and the light-shading layer.

Figure 4:
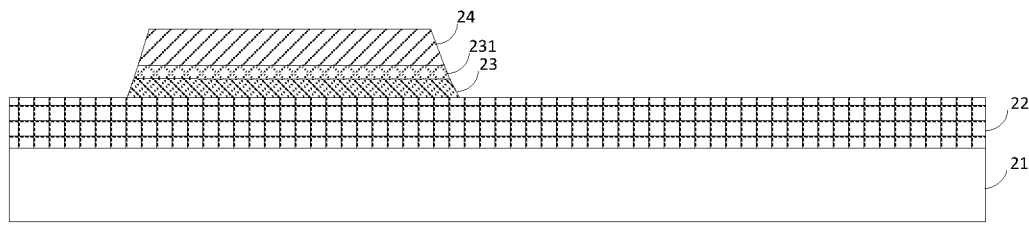
FIG. 4 is a structural schematic view showing step 4 of the manufacturing method of the array substrate according to the present invention.

As shown in FIG. 4, by a first mask, a whole layer of the semiconductor layer and a whole layer of the light-shading layer are simultaneously exposed and developed, and only portions of the light-shading layer 23, the insulation film 231, and the semiconductor layer 24 are covered on the buffer layer 22 in order. The semiconductor layer 24 is used for forming the channel. The material of the semiconductor layer 24 is, for example, a low temperature poly-silicon (LTPS). The insulation film 231 can effectively avoid that the electric charge in the channel is transferred into the light-shading layer 23.

S105: forming the first insulation layer 25 on the semiconductor layer 24 after the patterning process.

Figure 5:
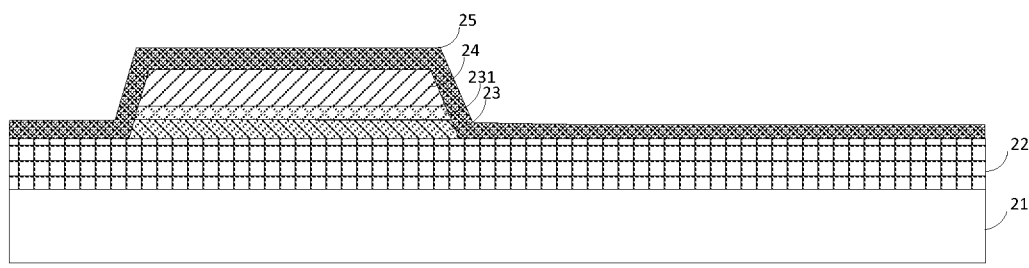
FIG. 5 is a structural schematic view showing step 5 of the manufacturing method of the array substrate according to the present invention.

As shown in FIG. 5, the material of the first insulation layer 25 can be inorganic transparent materials.

S106: forming the first metal layer on the first insulation layer 25.

Figure 6:
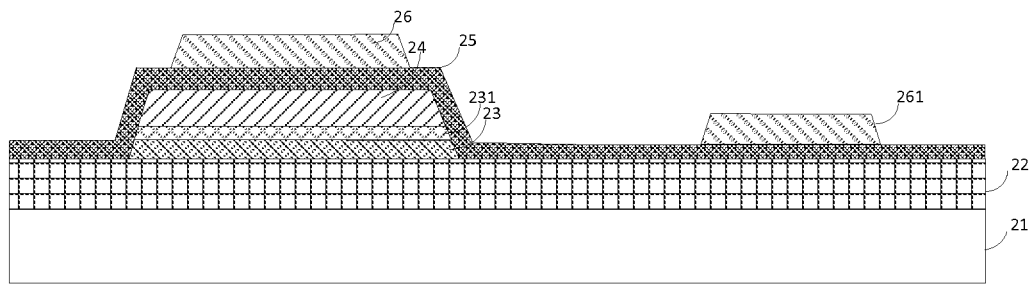
FIG. 6 is a structural schematic view showing step 6 of the manufacturing method of the array substrate according to the present invention.

As shown in FIG. 6, in the step S106, specifically, by a mask (second mask) with patterns, the first metal layer is exposed, developed, and etched to form the gate electrodes 26 and the common electrodes 261. The other part of the first metal layer excluding the gate electrodes 26 and the common electrodes 261 is etched in the process. The material of the first metal layer can be chromium, molybdenum, aluminum, or copper.

Preferably, after the step S106, meaning after forming the first metal layer on the first insulation layer, the method further comprises:

S201: by means of diffusion or ion implantation, doping a first trigger-conductivity material into a first portion of the patterned semiconductor layer.

Figure 7:
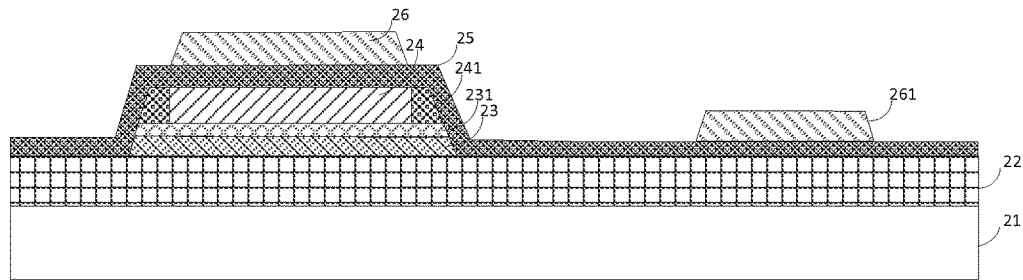
FIG. 7 is a structural schematic view showing step 7 of the manufacturing method of the array substrate according to the present invention.

As shown in FIG. 7, that is, processing a heavy doping to the first portion of the patterned semiconductor layer 24. The first trigger-conductivity material is used to increase the conductivity of the semiconductor layer. The density of the first trigger-conductivity material in the patterned semiconductor layer is greater than a first default density. The first portion 241 is a portion of the patterned semiconductor layer 24, which is uncovered by the gate electrodes 26. The first trigger-conductivity material is, for example, five valence elements: atoms of arsenic (As), antimony (Sb), or phosphorus (P). By step S201, the drain electrodes and the source electrodes obtained by the process respectively achieve an effect of ohmic contact with the semiconductor layer.

S202: etching the gate electrodes further, so as to decrease the area of the gate electrodes covering the semiconductor layer.

S203: doping a second trigger-conductivity material into a second portion of the patterned semiconductor layer 24 by means of diffusion or ion implantation.

Figure 8:
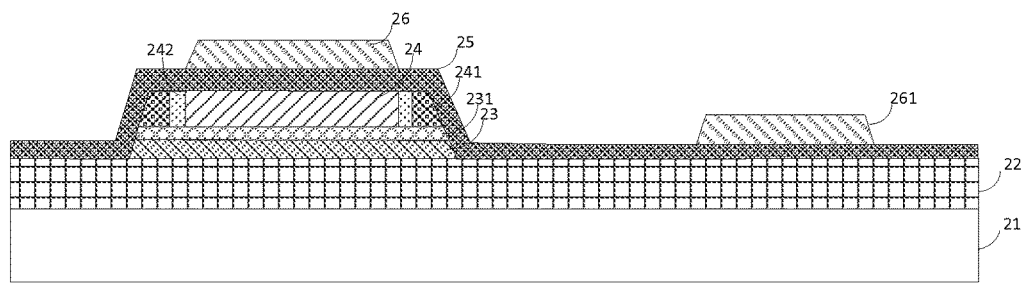
FIG. 8 is a structural schematic view showing step 8 of the manufacturing method of the array substrate according to the present invention.

As shown in FIG. 8, that is, processing a light doping to the second portion of the patterned semiconductor layer. The second trigger-conductivity material is used to increase the conductivity of the semiconductor layer. The density of the second trigger-conductivity material in the patterned semiconductor layer is less than a second default density. The second portion 242 is a portion of the patterned semiconductor layer, which is uncovered by the etched gate electrodes and has no overlap with the first portion 241. The second trigger-conductivity material is, for example, five valence elements: atoms of arsenic, antimony, or phosphorus. The first default density is greater than the second default density. After step S203, the electron mobility ratio of low temperature poly-silicon (LTPS) in the semiconductor layer can be improved.

In the conventional technology, a heavy doping needs a mask for the light-shading process. However, in the present invention, because the gate electrode area of the first metal layer is directly used to shade light for the semiconductor layer, it further reduces the manufacturing processes. In the conventional technology, a light doping also needs a mask for the light-shading process. However, in the present invention, by etching the gate electrode area and using the etched gate electrode area of the first metal layer to shade light for the semiconductor layer, it further can reduce the manufacturing processes.

S107: forming the second insulation layer 27 on the first metal layer.

Figure 9:
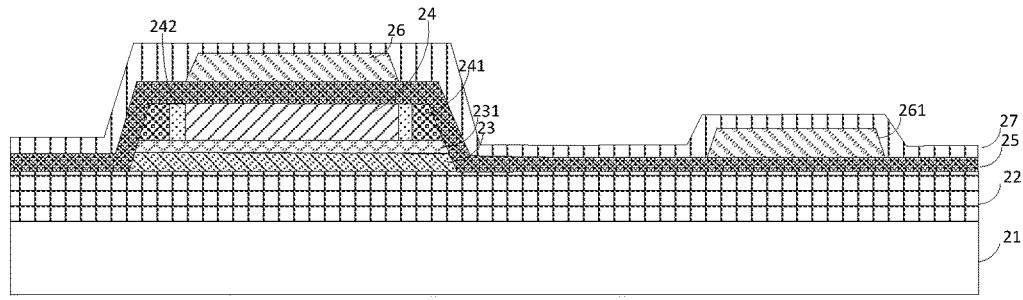
FIG. 9 is a structural schematic view showing step 9 of the manufacturing method of the array substrate according to the present invention.

As shown in FIG. 9, specifically, the second insulation layer 27 is formed on the first metal layer and the portion of the first insulation layer 25 which is uncovered by the first metal layer. The material of the second insulation layer 27 can be organic transparent materials.

Figure 10:
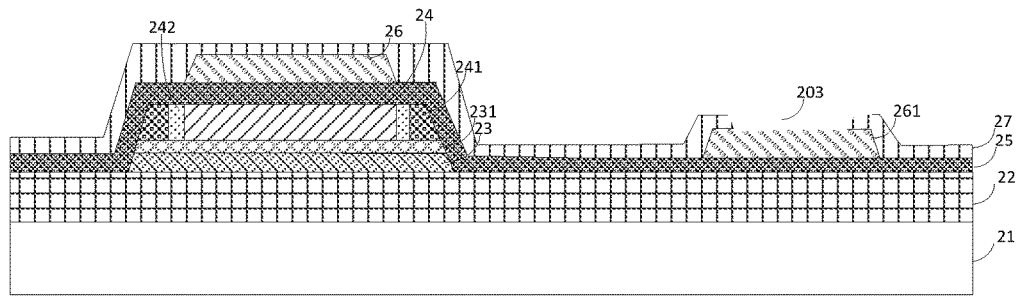
FIG. 10 is a structural schematic view showing step 10 of the manufacturing method of the array substrate according to the present invention.

Preferably, after step S107, meaning after forming the second insulation layer on the first metal layer, the method further comprises:

As shown in FIG. 10, S302: disposing a third via 203 on the second insulation layer 27 which corresponds to the common electrodes 261.

Figure 11:
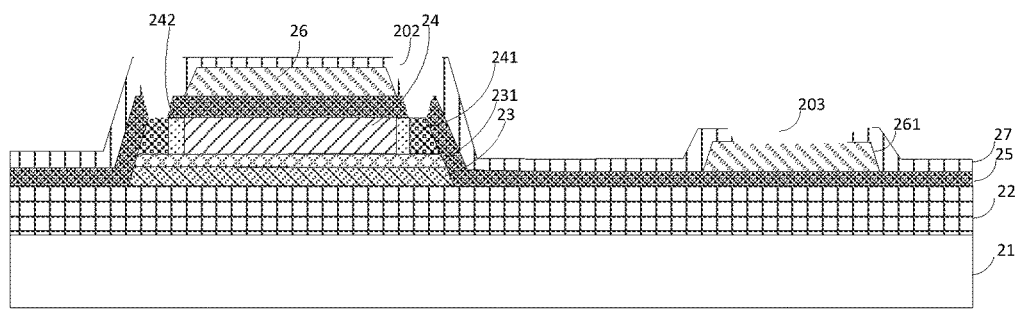
FIG. 11 is a structural schematic view showing step 11 of the manufacturing method of the array substrate according to the present invention.

Preferably, before step S108, meaning before forming the second metal layer on the second insulation layer, the method further comprises:

As shown in FIG. 11, S301: by a third mask, the second insulation layer and the first insulation layer are simultaneously exposed and developed; and disposing a second via 202 on the second insulation layer and the first insulation layer.

S108: forming the second metal layer 28 on the second insulation layer 27.

Figure 12:
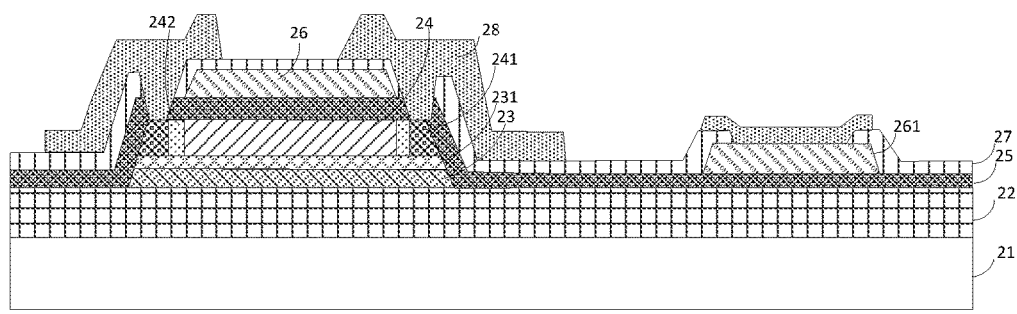
FIG. 12 is a structural schematic view showing step 12 of the manufacturing method of the array substrate according to the present invention.

As shown in FIG. 12, specifically, by a mask (fourth mask) with patterns, the second metal layer 28 is exposed, developed, and etched to form the drain electrodes and the source electrodes. The material of the second metal layer 28 can be chromium, molybdenum, aluminum, or copper.

Preferably, the second metal layer 28 is formed on the second insulation layer 27 and the third via 203, so that the second metal layer 28 can directly contact with the common electrodes 261, so as to avoid that the first metal layer being damaged when forming the third via because the thickness of the second metal layer 27 is thicker. The source electrodes and the drain electrodes are connected with the semiconductor layer 24 through two of the second via 202.

Figure 13:
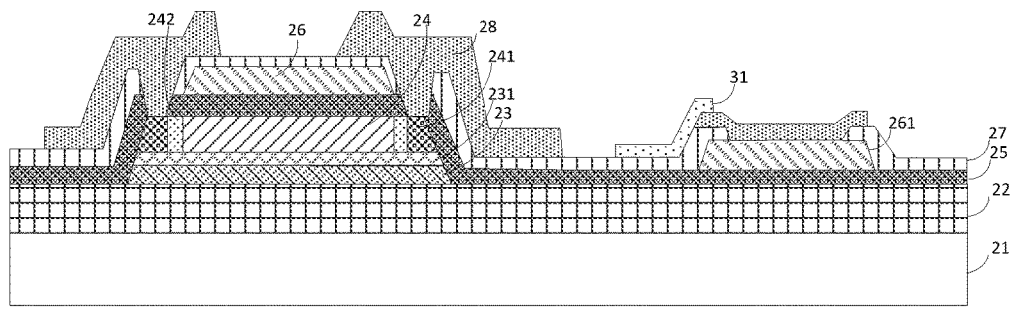
FIG. 13 is a structural schematic view showing step 13 of the manufacturing method of the array substrate according to the present invention.

Preferably, before step S109, meaning before forming the flat layer on the second metal layer and the second insulation layer uncovered by the second metal layer, the method further comprises:

As shown in FIG. 13, S303: forming the second transparent conductive layer 31 on the second metal layer which corresponds to the common electrodes.

A whole layer of the second transparent conductive layer is coated to the second metal layer; by a fifth mask, the second transparent conductive layer is exposed and developed, wherein the portion corresponding to the common electrode 261 is kept, and the other portion thereof is developed.

The second transparent conductive layer 31 is connected with the common electrode 261, and is used to form a storage electric capacity.

S109: forming the flat layer 29 on the second metal layer 28 and the second insulation layer 27 uncovered by the second metal layer 28.

Figure 14:
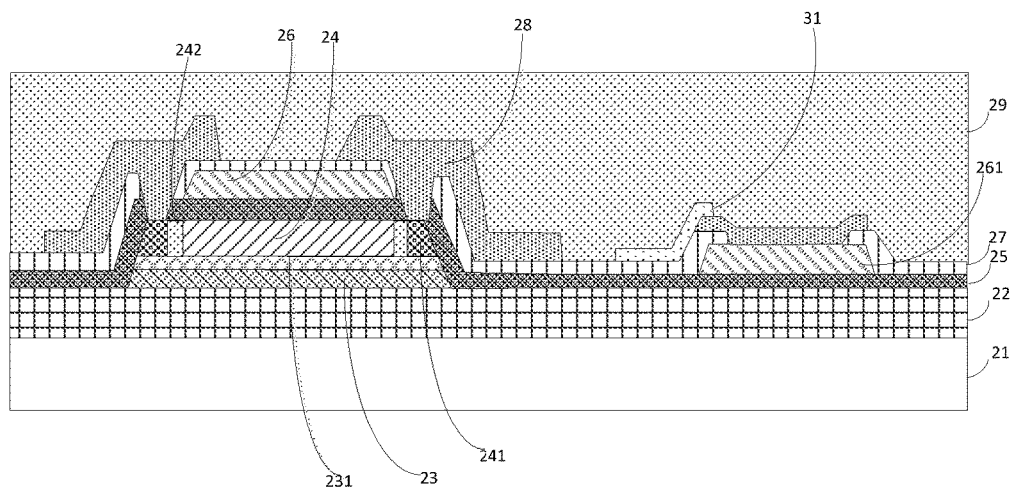
FIG. 14 is a structural schematic view showing step 14 of the manufacturing method of the array substrate according to the present invention.

As shown in FIG. 14, specifically, the flat layer 29 is formed on the second metal layer 28 uncovered by the second transparent conductive layer 31, the second transparent conductive layer 31, and the second insulation layer 27 uncovered by the second metal layer 28 and the second transparent conductive layer 31.

Figure 15:
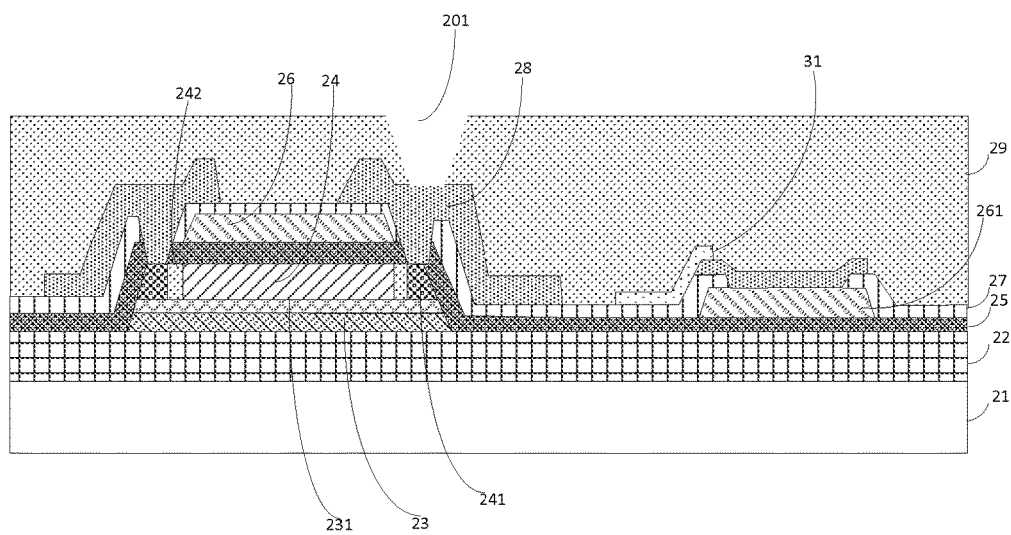
FIG. 15 is a structural schematic view showing step 15 of the manufacturing method of the array substrate according to the present invention.

Preferably, as shown in FIG. 15, the first via 201 is formed on the flat layer 29; and the first via 201 is formed by exposing and developing the flat layer with a sixth mask.

S110: forming the first transparent conductive layer 30 on the flat layer 29.

As shown in FIG. 2, a sputter coating method can be used to form the first transparent conductive layer 30 on the flat layer 29 having the first via. The first transparent conductive layer 30 is provided with pixel electrodes, and the pixel electrodes are formed by exposing and developing the first transparent conductive layer 30 with a seventh mask. The first transparent conductive layer 30 is connected with the second metal layer 28 through the first via 201, and the first transparent conductive layer 30 is connected with the source electrodes or drain electrodes.

In the conventional technology, the material of is usually metal, and the light-shading layer is used to avoid the electron mobility ratio of the semiconductor layer being changed when it is lit by a back light source. However, in the present invention, the material of the light-shading layer is an amorphous silicon. The amorphous silicon can absorb the lights which are produced by a change of the electron mobility ratio of carriers in the semiconductor layer, so that it can avoid the electron mobility ratio of the semiconductor layer being changed when it is lit by a back light source. Therefore, it is possible to simultaneously expose the material of the light-shading layer and the material of the semiconductor layer with one of the same masks, so that the exposing processes are reduced, the manufacturing processes are reduced, and the production cost is reduced.

In the array substrate and the manufacturing method thereof according to the present invention, by improving the conventional manufacturing method, to finish a whole layer of the manufacturing processes of the array substrate only needs seven masks, so that the manufacturing processes are reduced, and the production cost is reduced.

The present invention has been described with preferred embodiments thereof and it is understood that many changes and modifications to the described embodiment can be carried out without departing from the scope and the spirit of the invention that is intended to be limited only by the appended claims.

The invention claimed is:

1. A manufacturing method of an array substrate, comprising steps of:
    forming a buffer layer on a substrate;
    forming a whole light-shading layer on the buffer layer, wherein the material of the light-shading layer is an amorphous silicon;
    oxidizing the light-shading layer, so as to form an insulation film on the light-shading layer;
    forming a whole semiconductor layer on the insulation film, and simultaneously patterning the semiconductor layer and the light-shading layer, wherein portions of the light-shading layer and portions of the semiconductor layer are covered on the buffer layer in order; and the semiconductor layer is configured to form a channel;
    forming a first insulation layer on the patterned semiconductor layer;
    forming a first metal layer on the first insulation layer, wherein the first metal layer is patterned to form gate electrodes and common electrodes;
    forming a second insulation layer on the first metal layer;
    disposing a third via on the second insulation layer which corresponds to the common electrodes, wherein the second metal layer is contacted with the common electrodes;
    forming a second metal layer on the second insulation layer, wherein the second metal layer is patterned to form drain electrodes and source electrodes;
    forming a flat layer on the second metal layer and the second insulation layer uncovered by the second metal layer, wherein a first via is formed on the flat layer; and
    forming a first transparent conductive layer on the flat layer, wherein the first transparent conductive layer is connected with the second metal layer through the first via.

2. The manufacturing method of the array substrate according to claim 1, wherein after the step of forming the first metal layer on the first insulation layer, the method further comprises:
    doping a first trigger-conductivity material into a first portion of the patterned semiconductor layer by means of diffusion or ion implantation; wherein the first trigger-conductivity material is configured to increase the conductivity of the semiconductor layer; the density of the first trigger-conductivity material in the patterned semiconductor layer is greater than a first default density; and the first portion is a portion of the patterned semiconductor layer which is uncovered by the gate electrodes.

3. The manufacturing method of the array substrate according to claim 2, wherein the method further comprises:
    etching the gate electrodes further, so as to decrease the area of the gate electrodes covering the semiconductor layer; and
    doping a second trigger-conductivity material into a second portion of the patterned semiconductor layer by means of diffusion or ion implantation; wherein the second trigger-conductivity material is configured to increase the conductivity of the semiconductor layer; the density of the second trigger-conductivity material in the patterned semiconductor layer is less than a second default density; and the second portion is a portion of the patterned semiconductor layer which is uncovered by the etched gate electrodes and no overlap with the first portion.

4. The manufacturing method of the array substrate according to claim 1, wherein after the step of forming the second metal layer on the second insulation layer, the method further comprises:
    disposing a second via on the second insulation layer and the first insulation layer; wherein the source electrodes and the drain electrodes are connected with the semiconductor layer through the second via.

5. The manufacturing method of the array substrate according to claim 1, wherein the material of the insulation film is silica ($SiO_2$).

6. The manufacturing method of the array substrate according to claim 1, wherein before the step of forming the flat layer on the second metal layer and the second insulation layer uncovered by the second metal layer, the method further comprises:
    forming a second transparent conductive layer on the second metal layer which corresponds to the common electrodes.

7. The manufacturing method of the array substrate according to claim 1, wherein the first transparent conductive layer includes pixel electrodes.

8. The manufacturing method of the array substrate according to claim 1, wherein the material of the semiconductor layer is a low temperature poly-silicon (LTPS).

9. A manufacturing method of an array substrate, comprising steps of:

forming a buffer layer on a substrate;

forming a whole light-shading layer on the buffer layer;

forming a whole semiconductor layer on the light-shading layer, and simultaneously patterning the semiconductor layer and the light-shading layer, wherein portions of the light-shading layer and portions of the semiconductor layer are covered on the buffer layer in order; and the semiconductor layer is configured to form a channel;

forming a first insulation layer on the patterned semiconductor layer;

forming a first metal layer on the first insulation layer, wherein the first metal layer is patterned to form gate electrodes and common electrodes;

forming a second insulation layer on the first metal layer;

forming a second metal layer on the second insulation layer, wherein the second metal layer is patterned to form drain electrodes and source electrodes;

forming a flat layer on the second metal layer and the second insulation layer uncovered by the second metal layer, wherein a first via is formed on the flat layer; and forming a first transparent conductive layer on the flat layer, wherein the first transparent conductive layer is connected with the second metal layer through the first via.

10. The manufacturing method of the array substrate according to claim 9, wherein after the step of forming the first metal layer on the first insulation layer, the method further comprises:

doping a first trigger-conductivity material into a first portion of the patterned semiconductor layer by means of diffusion or ion implantation; wherein the first trigger-conductivity material is configured to increase the conductivity of the semiconductor layer; the density of the first trigger-conductivity material in the patterned semiconductor layer is greater than a first default density; and the first portion is a portion of the patterned semiconductor layer which is uncovered by the gate electrodes.

11. The manufacturing method of the array substrate according to claim 10, wherein the method further comprises:

etching the gate electrodes further, so as to decrease the area of the gate electrodes covering the semiconductor layer; and doping a second trigger-conductivity material into a second portion of the patterned semiconductor layer by means of diffusion or ion implantation; wherein the second trigger-conductivity material is configured to increase the conductivity of the semiconductor layer; the density of the second trigger-conductivity material in the patterned semiconductor layer is less than a second default density; and the second portion is a portion of the patterned semiconductor layer which is uncovered by the etched gate electrodes and no overlap with the first portion.

12. The manufacturing method of the array substrate according to claim 9, wherein after the step of forming the second metal layer on the second insulation layer, the method further comprises:

disposing a second via on the second insulation layer and the first insulation layer; wherein the source electrodes and the drain electrodes are connected with the semiconductor layer through the second via.

13. The manufacturing method of the array substrate according to claim 9, wherein the material of the light-shading layer is an amorphous silicon; and the method further comprises:

oxidizing the light-shading layer, so as to form an insulation film on the light-shading layer; wherein the material of the insulation film is silica ($SiO_2$).

14. The manufacturing method of the array substrate according to claim 9, wherein after the step of forming the second insulation layer on the first metal layer, the method further comprises:

disposing a third via on the second insulation layer which corresponds to the common electrodes, wherein the second metal layer is contacted with the common electrodes.

15. The manufacturing method of the array substrate according to claim 14, wherein before the step of forming the flat layer on the second metal layer and the second insulation layer uncovered by the second metal layer, the method further comprises:

forming a second transparent conductive layer on the second metal layer which corresponds to the common electrodes.

16. The manufacturing method of the array substrate according to claim 9, wherein the first transparent conductive layer includes pixel electrodes.

* * * * *